(12) United States Patent
Taniguchi

(10) Patent No.: US 12,506,463 B2
(45) Date of Patent: Dec. 23, 2025

(54) FILTER DEVICE

(71) Applicant: Murata Manufacturing Co., Ltd., Nagaokakyo (JP)

(72) Inventor: Yasumasa Taniguchi, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 241 days.

(21) Appl. No.: 18/137,628

(22) Filed: Apr. 21, 2023

(65) Prior Publication Data

US 2023/0299738 A1 Sep. 21, 2023

Related U.S. Application Data

(63) Continuation of application No. PCT/JP2021/047890, filed on Dec. 23, 2021.

(30) Foreign Application Priority Data

Dec. 25, 2020 (JP) ................. 2020-217396

(51) Int. Cl.
*H03H 9/205* (2006.01)
*H03H 9/02* (2006.01)
(Continued)

(52) U.S. Cl.
CPC ........ *H03H 9/205* (2013.01); *H03H 9/02015* (2013.01); *H03H 9/14541* (2013.01); *H03H 9/54* (2013.01); *H03H 9/6483* (2013.01)

(58) Field of Classification Search
CPC ............... H03H 9/205; H03H 9/02015; H03H 9/14541; H03H 9/54; H03H 9/6483; H03H 9/02574; H03H 9/02858; H03H 9/02881; H03H 9/0547; H03H 9/1071; H03H 9/14526; H03H 9/14547; H03H 9/14558; H03H 9/1457; H03H 9/14573; H03H 9/542; H03H 9/17; H03H 9/605
See application file for complete search history.

(56) References Cited

U.S. PATENT DOCUMENTS

| | | | |
|---|---|---|---|
| 2010/0188166 A1* | 7/2010 | Hara | ............ H03H 9/605 333/133 |
| 2015/0180447 A1 | 6/2015 | Okuda | |

(Continued)

FOREIGN PATENT DOCUMENTS

| | | |
|---|---|---|
| JP | 2019068295 A | 4/2019 |
| JP | 2020014104 A | 1/2020 |

(Continued)

OTHER PUBLICATIONS

International Search Report in PCT/JP2021/047890, mailed Mar. 15, 2022, 4 pages.

(Continued)

*Primary Examiner* — John W Poos
(74) *Attorney, Agent, or Firm* — Keating & Bennett, LLP

(57) ABSTRACT

A filter device includes resonators including at least one series arm resonator and at least one parallel arm resonator. The resonators include a parallel arm resonator defining and functioning as a first resonator with a largest fractional bandwidth among the resonators, and at least one second resonator. The filter device includes an inductor connected in series to the first resonator.

16 Claims, 10 Drawing Sheets

(51) Int. Cl.
    *H03H 9/145*     (2006.01)
    *H03H 9/54*     (2006.01)
    *H03H 9/64*     (2006.01)

(56) References Cited

U.S. PATENT DOCUMENTS

| | | | |
|---|---|---|---|
| 2016/0065176 A1* | 3/2016 | Taniguchi | H03H 9/6426 |
| | | | 333/195 |
| 2017/0077896 A1 | 3/2017 | Sugaya et al. | |
| 2019/0140618 A1 | 5/2019 | Takamine | |
| 2019/0273521 A1* | 9/2019 | Nishikawa | H03H 9/6483 |
| 2019/0379355 A1* | 12/2019 | Sugahara | H03H 9/605 |
| 2020/0028490 A1 | 1/2020 | Kato | |
| 2020/0091892 A1 | 3/2020 | Watanabe et al. | |
| 2020/0204158 A1 | 6/2020 | Nosaka | |
| 2020/0220522 A1 | 7/2020 | Nosaka | |
| 2020/0403603 A1 | 12/2020 | Daimon et al. | |
| 2021/0111697 A1 | 4/2021 | Daimon et al. | |

FOREIGN PATENT DOCUMENTS

| | | |
|---|---|---|
| JP | 2020102814 A | 7/2020 |
| KR | 20150041143 A | 4/2015 |
| KR | 20190135542 A | 12/2019 |
| KR | 20200010016 A | 1/2020 |
| KR | 20200110142 A | 9/2020 |
| WO | 2014045726 A1 | 3/2014 |
| WO | 2016136413 A1 | 9/2016 |
| WO | 2018216417 A1 | 11/2018 |
| WO | 2019065274 A1 | 4/2019 |
| WO | 2019177028 A1 | 9/2019 |
| WO | 2020009121 A1 | 1/2020 |

OTHER PUBLICATIONS

Written Opinion in PCT/JP2021/047890, mailed Mar. 15, 2022, 5 pages.

* cited by examiner

FILTER DEVICE

CROSS REFERENCE TO RELATED APPLICATIONS

This application claims the benefit of priority to Japanese Patent Application No. 2020-217396 filed on Dec. 25, 2020 and is a Continuation Application of PCT Application No. PCT/JP2021/047890 filed on Dec. 23, 2021. The entire contents of each application are hereby incorporated herein by reference.

BACKGROUND OF THE INVENTION

1. Field of the Invention

The present invention relates to a filter device including a ladder circuit.

2. Description of the Related Art

An acoustic wave device has been widely used in a filter of a mobile phone or the like. Japanese Unexamined Patent Application Publication No. 2019-068295 discloses an example of a ladder filter in which an acoustic wave device is used for a series arm resonator and a parallel arm resonator. In the ladder filter, five series arm resonators are connected in series with each other between two terminals. An inductor is connected between the series arm resonators at both ends and both of the terminals, respectively. Resonant frequencies of the series arm resonators at both ends are different from a resonant frequency of the three series arm resonators other than the series arm resonators at both ends. With this, it is intended that a pass band of the ladder filter is widened and attenuation outside the pass band is increased.

In a ladder filter, an acoustic wave resonator having a fractional bandwidth of a small value is sometimes used to increase steepness at an end portion of a pass band. Whereas, there is a case that an acoustic wave resonator having a fractional bandwidth of a large value is used to expand a pass band. In order to achieve high steepness and a wide pass band, both an acoustic wave resonator having a fractional bandwidth of a small value and an acoustic wave resonator having a fractional bandwidth of a large value are required.

Sometimes, an inductor is connected to an acoustic wave resonator in order to increase a value of a fractional bandwidth of the acoustic wave resonator. Increasing inductance of the inductor may increase the value of the fractional bandwidth. However, when the inductance of the inductor is increased, the inductor becomes large, and the filter device as a whole tends to become large.

SUMMARY OF THE INVENTION

Preferred embodiments of the present invention provide filter devices in each of which a pass band is widened and a reduced size is obtained.

A filter device according to a preferred embodiment of the present invention includes a plurality of resonators including at least one series arm resonator and at least one parallel arm resonator. The plurality of resonators include a first resonator with a fractional bandwidth with a largest value among the plurality of resonators and at least one second resonator, and an inductor is connected in series to the first resonator.

With the filter devices according to preferred embodiments of the present invention, a pass band is widened and a reduced size is obtained.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Hereinafter, preferred embodiments of the present invention will be described with reference to the drawings to clarify the present invention.

The preferred embodiments described in the present description are exemplary, and partial replacement or combination of configurations is possible between different preferred embodiments.

Figure 1:
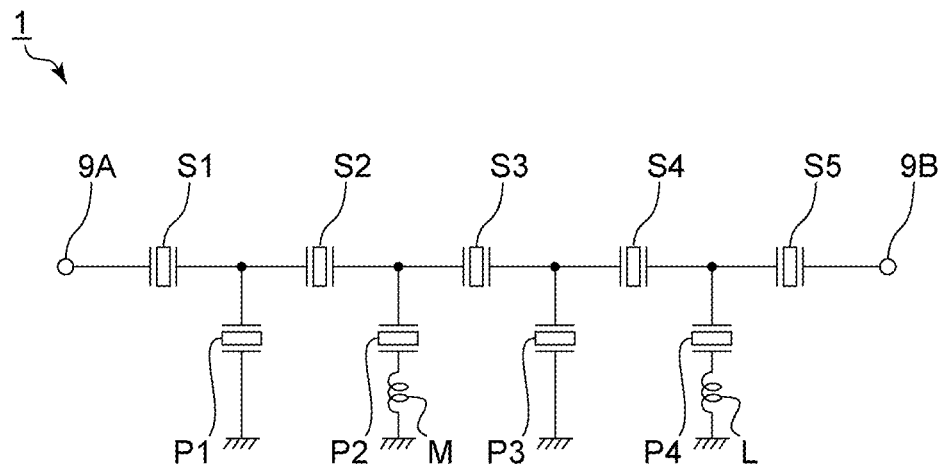
FIG. 1 is a circuit diagram of a filter device according to a first preferred embodiment of the present invention.

FIG. 1 is a circuit diagram of a filter device according to a first preferred embodiment of the present invention.

A filter device 1 includes a first signal terminal 9A and a second signal terminal 9B, and multiple resonators. Specifically, the multiple resonators include multiple series arm resonators and multiple parallel arm resonators. The multiple series arm resonators are series arm resonators S1, S2, S3, S4, and S5. The multiple parallel arm resonators are parallel arm resonators P1, P2, P3, and P4. In the present preferred embodiment, all of the multiple resonators are acoustic wave resonators. Specifically, the multiple resonators are surface acoustic wave resonators, for example. The multiple resonators may be, for example, bulk wave resonators.

In the present preferred embodiment, the first signal terminal 9A is an antenna terminal. That is, the first signal terminal 9A is connected to an antenna. Each of the first signal terminal 9A and the second signal terminal 9B may be provided as an electrode pad or may be provided as a wiring line.

The series arm resonators S1, S2, S3, S4, and S5 are connected in series with each other between the first signal terminal 9A and second signal terminal 9B. The parallel arm resonator P1 is connected between a ground electric potential and a connection point of the series arm resonators S1 and S2. The parallel arm resonator P2 is connected between the ground electric potential and a connection point of the series arm resonators S2 and S3. The parallel arm resonator P3 is connected between the ground electric potential and a connection point of the series arm resonators S3 and S4. The parallel arm resonator P4 is connected between the ground electric potential and a connection point of the series arm resonators S4 and S5. It is sufficient that the multiple resonators of the filter device 1 include at least one series arm resonator and at least one parallel arm resonator. It is sufficient that the filter device 1 includes a ladder circuit. The filter device 1 may include a longitudinally coupled resonator acoustic wave filter, for example.

Here, the multiple resonators include a first resonator and multiple second resonators. A value of a fractional bandwidth of the first resonator is the largest among values of fractional bandwidths of the multiple resonators. The second resonators are all resonators other than the first resonator. In the present preferred embodiment, the first resonator is the parallel arm resonator P4. The second resonators are the series arm resonators S1, S2, S3, S4 and S5, and parallel arm resonators P1, P2 and P3. In the present description, a fractional bandwidth refers to a fractional bandwidth of each resonator. That is, when a fractional bandwidth is denoted as $\Delta f$, a resonant frequency is denoted as fr, and an anti-resonant frequency is denoted as fa, an equation $\Delta f=(|fa-fr|/fr) \times 100$ [%] is satisfied. The fractional bandwidth of the first resonator is, for example, about 5%. The fractional bandwidth of each second resonator is, for example, about 3%. However, the fractional bandwidths of the first resonator and the second resonator are not limited to the above.

The filter device 1 includes a first inductor and a second inductor. The first inductor is an inductor connected in series to the first resonator. The second inductor is an inductor connected to the second resonator. Specifically, the first inductor is an inductor L. The second inductor is an inductor M. The inductor L is connected between the ground electric potential and the parallel arm resonator P4 being the first resonator. The inductor L is connected to the parallel arm resonator P4 without any other resonators interposed therebetween. The inductor M is connected between the ground electric potential and the parallel arm resonator P2.

The inductor L is an inductor to increase a fractional bandwidth of the parallel arm resonator P4. With this, a pass band of the filter device 1 may be widened. Whereas, the inductor M is an inductor for impedance matching.

In the present preferred embodiment, the inductor L defining and functioning as the first inductor is connected in series to the parallel arm resonator P4 defining and functioning as the first resonator. As described above, the value of the fractional bandwidth of the first resonator is the largest among the values of the fractional bandwidths of the multiple resonators. Thus, the inductance of the first inductor required to increase the value of the fractional bandwidth of the first resonator may be decreased. With this, the first inductor may be made small. Accordingly, the pass band of the filter device 1 may be widened, and in addition, the size reduction may be effectively further achieved. This will be described in more detail below.

When an inductor is connected to an acoustic wave resonator, a resonant frequency lowers, but an anti-resonant frequency does not change. With this, a value of a fractional bandwidth increases. Here, in a case that inductors are respectively connected to first and second resonators, inductance values of the inductors required to lower a resonant frequency by about 50 MHz were compared. In the comparison, a fractional bandwidth of the first resonator was set to, for example, about 5%, and a fractional bandwidth of the second resonator was set to, for example, about 3% as in the first preferred embodiment. Furthermore, the same comparison as described above was made by changing a resonant frequency lowering range with about a 10 MHZ step, in a range from about 10 MHz or more to about 100 MHz or less.

Figure 2:
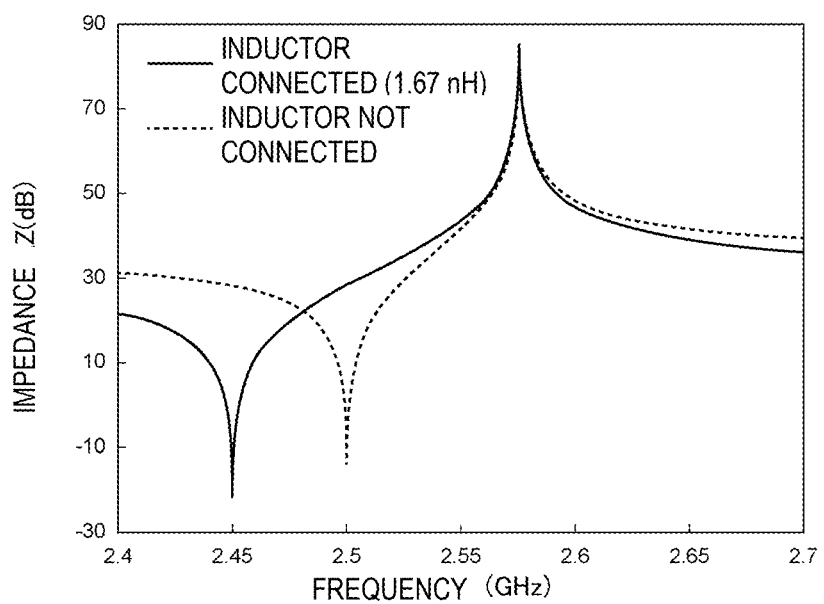
FIG. 2 is a graph showing a change in a fractional bandwidth when an inductor is connected to a second resonator.
Figure 3:
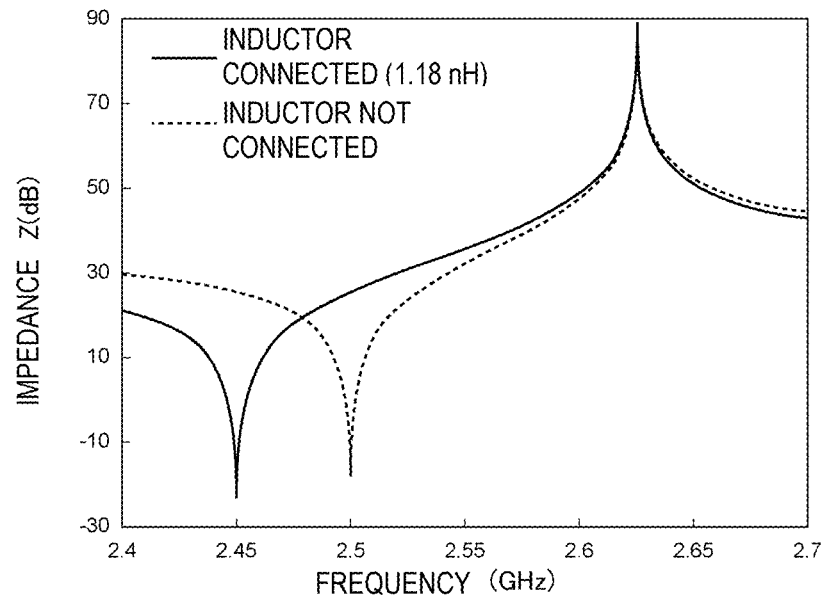
FIG. 3 is a graph showing a change in a fractional bandwidth when an inductor is connected to a first resonator.
Figure 4:
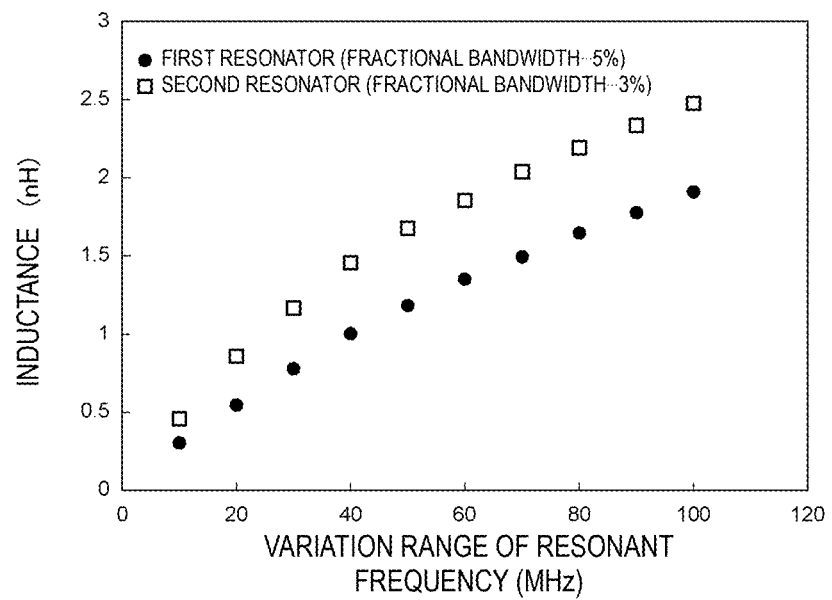
FIG. 4 is a graph showing a relationship between inductance of an inductor and a variation range of a resonant frequency in a case that an inductor is connected to a resonator.

FIG. 2 is a graph showing a change in a fractional bandwidth when an inductor is connected to the second resonator. FIG. 3 is a graph showing a change in a fractional bandwidth when an inductor is connected to the first resonator. FIG. 4 is a graph showing a relationship between inductance of an inductor and a variation range of a resonant frequency in a case that the inductor is connected to a resonator.

As in FIG. 2 and FIG. 3, each of the resonant frequencies of the first and second resonators becomes lower by about 50 MHZ. At this time, as in FIG. 2, the inductance of the inductor connected to the second resonator is about 1.67 nH. Whereas, as in FIG. 3, the inductance of the inductor connected to the first resonator is about 1.18 nH. Furthermore, as in FIG. 4, the inductance of the inductor connected to the first resonator is smaller than the inductance of the inductor connected to the second resonator even when a variation range of a resonant frequency is other than about 50 MHz. Thus, in the first resonator, it is possible to efficiently increase a value of the fractional bandwidth. Table 1 shows a result of FIG. 4.

TABLE 1

| Variation range of resonant frequency (MHz) | Inductance (nH) | |
|---|---|---|
| | First resonator (fractional bandwidth 5%) | Second resonator (fractional bandwidth 3%) |
| 10 | 0.3 | 0.45 |
| 20 | 0.55 | 0.85 |
| 30 | 0.78 | 1.17 |
| 40 | 1 | 1.45 |

TABLE 1-continued

| Variation range of resonant frequency (MHz) | Inductance (nH) | |
| --- | --- | --- |
| | First resonator (fractional bandwidth 5%) | Second resonator (fractional bandwidth 3%) |
| 50 | 1.18 | 1.67 |
| 60 | 1.35 | 1.86 |
| 70 | 1.5 | 2.04 |
| 80 | 1.65 | 2.2 |
| 90 | 1.78 | 2.34 |
| 100 | 1.91 | 2.48 |

As described above, it was discovered that the inductance of the inductor required to increase the value of the fractional bandwidth in the first resonator is smaller than the inductance of the inductor required to increase the value of the fractional bandwidth in the second resonator. Therefore, when a pass band of a filter device is widened, an inductor connected to the first resonator may be reduced in size.

In the present preferred embodiment, the inductance of the inductor M defining and functioning as the second inductor is smaller than the inductance of the inductor L defining and functioning as the first inductor. Therefore, the reduction of the size of the filter device 1 may be achieved more reliably.

As illustrated in FIG. 1, the inductor L is preferably connected between the parallel arm resonator P4 and the ground electric potential. With this, impedance matching may be easily performed. The inductor L may be connected between the parallel arm resonator P4 and the connection point of the series arm resonators S4 and S5. That is, the first inductor may be connected between the first resonator and a connection point of the second resonators connected to the first resonator.

When a filter device includes the multiple first resonators, the first inductor is preferably connected in series to any one of the first resonators.

Hereinafter, a configuration of the filter device 1 of the present preferred embodiment will be described in detail.

Figure 5:
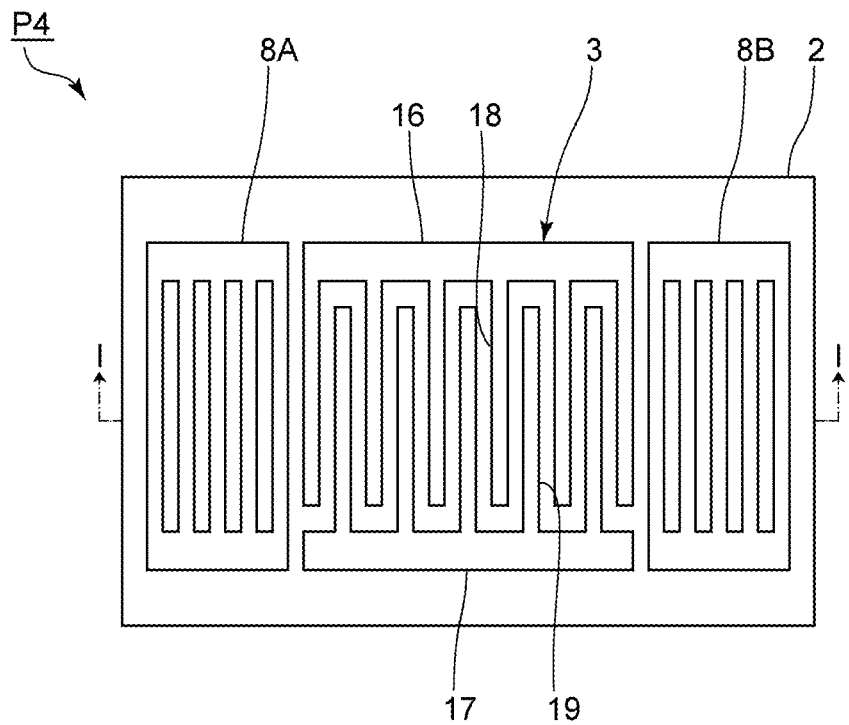
FIG. 5 is a plan view of the first resonator according to the first preferred embodiment of the present invention.

FIG. 5 is a plan view of a first resonator according to the first preferred embodiment of the present invention.

The parallel arm resonator P4 defining and functioning as the first resonator includes a piezoelectric substrate 2. An IDT electrode 3 is provided on the piezoelectric substrate 2. Applying an AC voltage to the IDT electrode 3 makes a surface acoustic wave be excited. A pair of reflectors 8A and 8B are provided on both sides of the IDT electrode 3 in an acoustic wave propagation direction on the piezoelectric substrate 2.

The IDT electrode 3 includes a first busbar 16, a second busbar 17, multiple first electrode fingers 18, and multiple second electrode fingers 19. The first busbar 16 and the second busbar 17 face each other. One end of each of the multiple first electrode fingers 18 is connected to the first busbar 16, respectively. One end of each of the multiple second electrode fingers 19 is connected to the second busbar 17, respectively. The multiple first electrode fingers 18 and the multiple second electrode fingers 19 are interdigitated with each other. Each of the IDT electrode 3, the reflector 8A, and the reflector 8B may be structured of a single-layer metal film or a laminated metal film. Hereinafter, the first electrode finger 18 and the second electrode finger 19 may be collectively referred to as an electrode finger.

A dielectric film may be provided on the piezoelectric substrate 2 to cover the IDT electrode 3. With this, the IDT electrode 3 is less likely to be damaged. Examples of the material of the dielectric film include silicon oxide, silicon nitride, silicon oxynitride, or the like.

Figure 6:
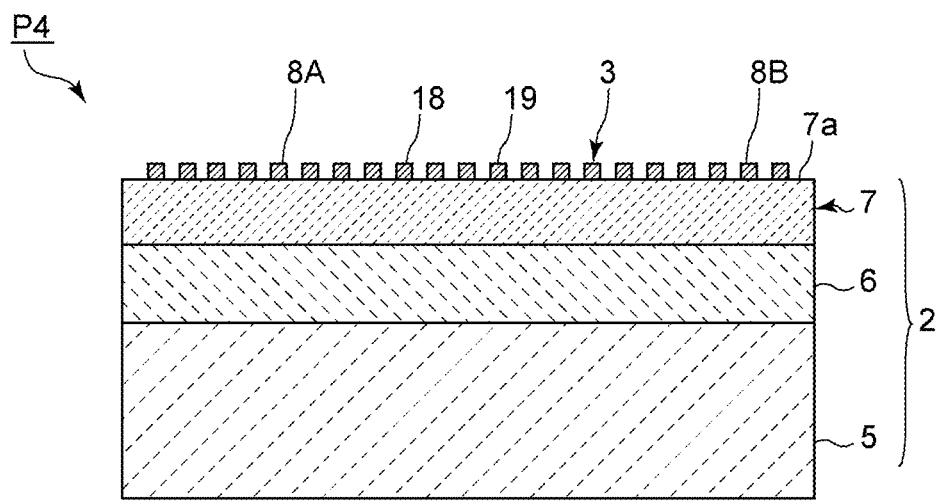
FIG. 6 is a sectional view taken along a line I-I in FIG. 5.

FIG. 6 is a sectional view taken along a line I-I in FIG. 5.

The piezoelectric substrate 2 of the present preferred embodiment includes a high acoustic velocity support substrate 5 defining and functioning as a high acoustic velocity material layer, a low acoustic velocity film 6, and a piezoelectric layer 7. More specifically, the low acoustic velocity film 6 is provided on the high acoustic velocity support substrate 5. The piezoelectric layer 7 is provided on the low acoustic velocity film 6. The piezoelectric layer 7 includes a main surface 7a. The IDT electrode 3, the reflector 8A, and the reflector 8B are provided on the main surface 7a of the piezoelectric layer 7.

Examples of the material of the piezoelectric layer 7 include lithium tantalate, lithium niobate, zinc oxide, aluminum nitride, crystal, lead zirconate titanate (PZT), or the like.

The high acoustic velocity material layer is a layer having a relatively high acoustic velocity. More specifically, an acoustic velocity of a bulk wave propagating through the high acoustic velocity material layer is higher than an acoustic velocity of an acoustic wave propagating through the piezoelectric layer 7. In the present preferred embodiment, the high acoustic velocity material layer is the high acoustic velocity support substrate 5. Examples of the material of the high acoustic velocity material layer include a medium including a material below as a main component. The material includes, for example, silicon, aluminum oxide, silicon carbide, silicon nitride, silicon oxynitride, sapphire, lithium tantalate, lithium niobate, quartz, alumina, zirconia, cordierite, mullite, steatite, forsterite, magnesia, a diamond-like carbon (DLC) film, diamond, or the like.

The low acoustic velocity film 6 is a film having a relatively low acoustic velocity. More specifically, an acoustic velocity of a bulk wave propagating through the low acoustic velocity film 6 is lower than an acoustic velocity of a bulk wave propagating through the piezoelectric layer 7. Examples of the material of the low acoustic velocity film 6 include glass, silicon oxide, silicon oxynitride, lithium oxide, tantalum pentoxide, or a material including a compound obtained by adding fluorine, carbon, or boron to silicon oxide as a main component.

In the present preferred embodiment, the high acoustic velocity support substrate 5 defining and functioning as the high acoustic velocity material layer, the low acoustic velocity film 6, and the piezoelectric layer 7 are laminated in this order. With this, energy of an acoustic wave may effectively be confined to a side of the piezoelectric layer 7. However, a configuration of the piezoelectric substrate 2 is not limited to that described above.

Other resonators each include an IDT electrode and a pair of reflectors in the same or similar manner to the parallel arm resonator P4. In the filter device 1, all of the resonators share the piezoelectric substrate 2. At least one resonator may include a piezoelectric substrate different from that of other resonators.

As described above, by connecting the inductor L to the parallel arm resonator P4, the pass band of the filter device 1 may be widened. Comparison of the present preferred embodiment and a comparative example will be described. The comparative example is different from the first preferred embodiment in that the inductor L is not provided. Configurations of the piezoelectric substrate 2 and the IDT electrode 3 in the filter device 1, and the inductance of each of the inductor L and the inductor M were made as follows.

Parameters in the comparative example are the same as the following parameters, except for the inductor L.

High acoustic velocity support substrate 5; material: Si, thickness: about 125 μm Low acoustic velocity film 6; material: SiO$_2$, thickness: about 670 nm Piezoelectric layer 7; material: LiTaO3, thickness: about 600 nm IDT electrode 3; lamination structure: Ti layer/AlCu layer from the side of the piezoelectric layer 7, thickness: 12 nm/162 nm from the side of the piezoelectric layer 7

Inductor L; inductance: about 3 nH

Inductor M; inductance: about 0.3 nH

Figure 7:
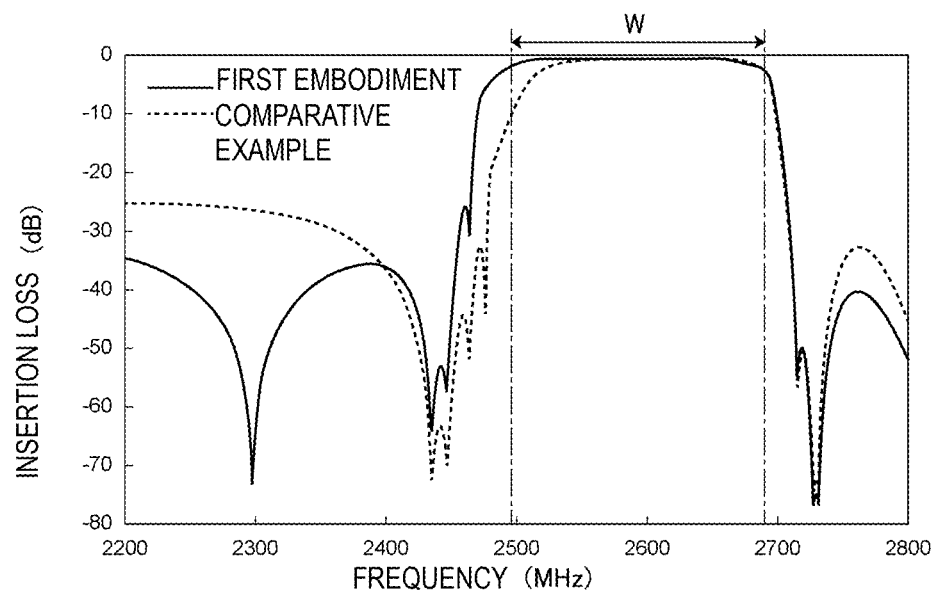
FIG. 7 is a graph showing attenuation-frequency characteristics of the first preferred embodiment of the present invention and a comparative example.

FIG. 7 is a graph showing attenuation-frequency characteristics of the first preferred embodiment and the comparative example.

As in FIG. 7, it was discovered that the pass band of the first preferred embodiment is wider than that of the comparative example. A band W in FIG. 7 indicates a pass band of Band41. Specifically, the pass band of Band41 is about 2496 MHZ to about 2690 MHz. In a filter device of the comparative example, insertion loss is large near about 2496 MHZ. Meanwhile, in the first preferred embodiment, the inductor L is connected to the parallel arm resonator P4. As a result, the pass band of the filter device 1 is widened, and the insertion loss is small in about 2496 MHz to about 2690 MHz. Therefore, the filter device 1 may be applied to a wide band such as Band41. In addition, as described above, the inductor L for widening the pass band may be reduced in size, and the reduction of the size of the filter device 1 may be further achieved.

Figure 8:
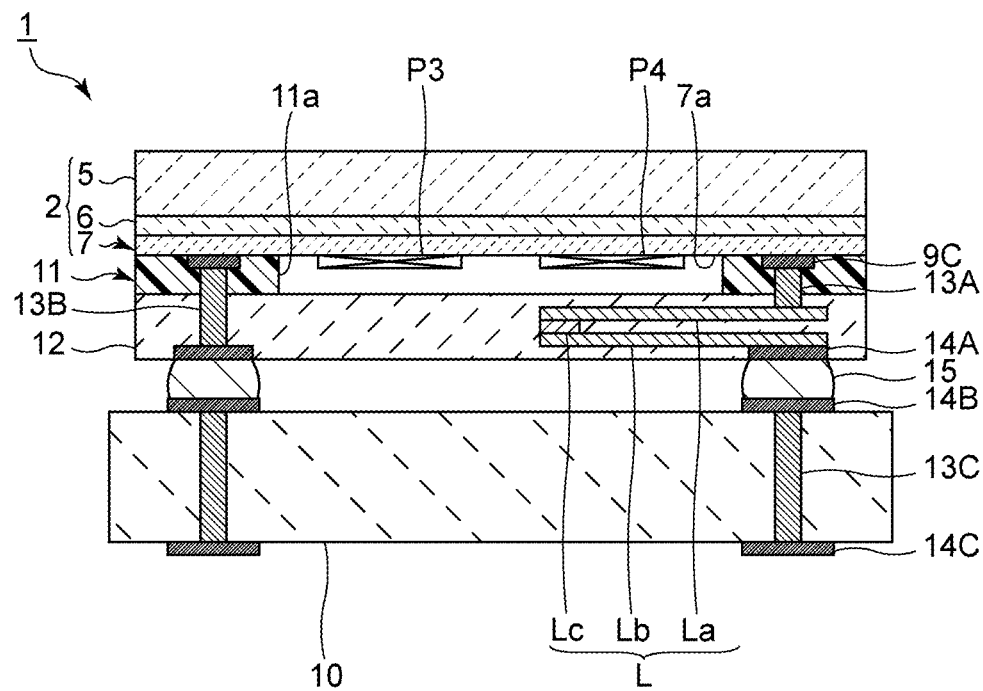
FIG. 8 is a schematic front sectional view of the filter device according to the first preferred embodiment of the present invention.

FIG. 8 is a schematic front sectional view of the filter device according to the first preferred embodiment. In FIG. 8, electrodes defining a resonator are indicated by a schematic diagram in which two diagonal lines are added to a rectangle.

The filter device 1 includes a mounting substrate 10. The multiple resonators of the filter device 1 are disposed on the mounting substrate 10. In the present preferred embodiment, the inductor L is provided between the mounting substrate 10 and an electrode that defines the parallel arm resonator P4 defining and functioning as the first resonator.

Multiple IDT electrodes of the multiple resonators are provided on the main surface 7a of the piezoelectric layer 7. Furthermore, multiple terminals are provided on the main surface 7a. The multiple terminals include multiple ground terminals 9C, the first signal terminal 9A, and the second signal terminal 9B.

Furthermore, a support member 11 is provided on the main surface 7a. The support member 11 covers at least a portion of the multiple terminals. The support member 11 includes a cavity 11a. The cavity 11a surrounds the multiple IDT electrodes of the multiple resonators. A cover member 12 is provided such that the cover member 12 and the piezoelectric layer 7 sandwich the support member 11. The cover member 12 covers the cavity 11a of the support member 11. With this, a hollow space is provided and is surrounded the piezoelectric substrate 2, the support member 11, and the cover member 12. The multiple IDT electrodes are disposed in the hollow space.

The inductor L defining and functioning as the first inductor is provided inside the cover member 12. The inductor L is defined by a wiring line. More specifically, the inductor L includes a wiring electrode La, a wiring electrode Lb, and a via electrode Lc. The wiring electrode La and the wiring electrode Lb are connected to the via electrode Lc. With this, the inductor L is provided. The second inductor is configured in the same or similar manner to the inductor L. A configuration of routing of the wiring line in each inductor is not particularly limited. The number of wiring electrodes and via electrodes of each inductor is not particularly limited.

Multiple first through-electrodes are provided to penetrate through the support member 11. The multiple first through-electrodes include a first through-electrode 13A and a first through-electrode 13B. One end of the first through-electrode 13A is connected to the ground terminal 9C. The other end of the first through-electrode 13A is connected to the wiring electrode La. The cover member 12 is provided with multiple first connection terminals 14A. The wiring electrode Lb is connected to the first connection terminal 14A. As described above, the first through-electrode 13A is connected to the first connection terminal 14A via the inductor L.

Whereas, the first through-electrode 13B penetrates through the cover member 12. One end of the first through-electrode 13B is connected to the ground terminal 9C. The other end of the first through-electrode 13B is connected to the first connection terminal 14A.

Multiple second connection terminals 14B are provided on one main surface of the mounting substrate 10. Multiple third connection terminals 14C are provided on the other main surface of the mounting substrate 10. Furthermore, multiple second through-electrodes 13C are provided to penetrate through the mounting substrate 10. One end of the second through-electrode 13C is connected to the second connection terminal 14B. The other end of the second through-electrode 13C is connected to the third connection terminal 14C.

A bump 15 is provided to connect the second connection terminal 14B of the mounting substrate 10 and the first connection terminal 14A on a side of the multiple resonators. The parallel arm resonator P4 is connected to the ground electric potential via the ground terminal 9C, the first through-electrode 13A, the inductor L, the first connection terminal 14A, the bump 15, the second connection terminal 14B, the second through-electrode 13C, and the third connection terminal 14C. Among the multiple second resonators, the parallel arm resonator P3, for example, is connected to the ground electric potential via the ground terminal 9C, the first through-electrode 13B, the first connection terminal 14A, the bump 15, the second connection terminal 14B, the second through-electrode 13C, and the third connection terminal 14C. As described above, each of the multiple resonators of the filter device 1 has, for example, a Wafer Level Package (WLP) structure. However, each of the multiple resonators is not limited to having the WLP structure.

In a case that the inductor is defined by a wiring line, the longer the wiring electrode or the via electrode is, the larger the inductance will be. Therefore, the larger the required inductance is, the larger the inductor will be. Meanwhile, in the present preferred embodiment, even when the inductance of the inductor L is small, the value of the fractional bandwidth of the parallel arm resonator P4 may be made large. Therefore, the inductor L is preferably defined by a wiring line.

Figure 9:
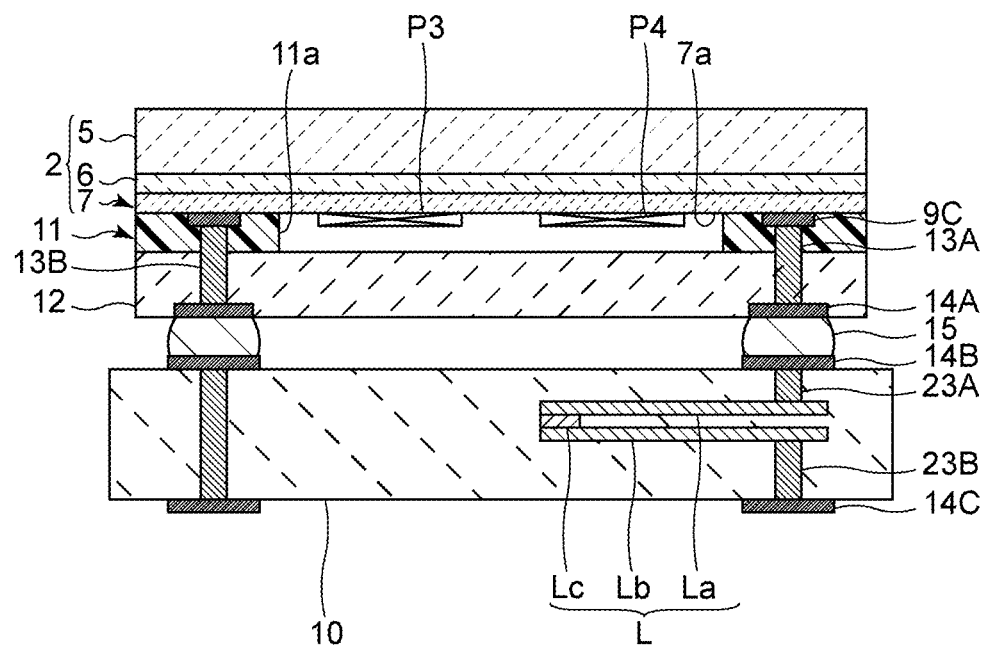
FIG. 9 is a schematic front sectional view of a filter device according to a first modification of the first preferred embodiment of the present invention.

The inductor L may be provided in a portion other than the cover member 12. For example, in a first modification in FIG. 9, the inductor L is provided in the mounting substrate 10. The inductor L is connected to the second connection terminal 14B by a via electrode 23A. Furthermore, the inductor L is connected to the third connection terminal 14C by a via electrode 23B. The inductor L is not limited to being provided in the cover member 12 or the mounting substrate 10 and may be, for example, provided on a surface of the cover member 12 or the mounting substrate 10. Alternatively, for example, the inductor L may be provided on the piezoelectric substrate 2.

Figure 10:
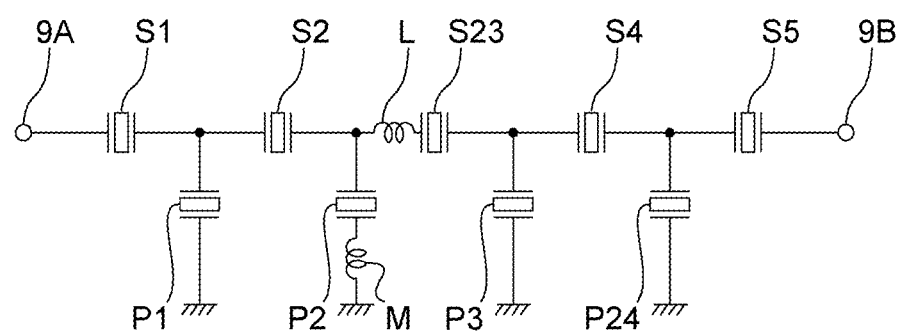
FIG. 10 is a circuit diagram of a filter device according to a second modification of the first preferred embodiment of the present invention.

In the first preferred embodiment, the first resonator is a parallel arm resonator. The first resonator may also be a series arm resonator. For example, in a second modification in FIG. 10, a series arm resonator S23 has the largest fractional bandwidth among multiple resonators. That is, the series arm resonator S23 is the first resonator, and other resonators including a parallel arm resonator P24 are the multiple second resonators. An inductor L defining and functioning as the first inductor is connected between the series arm resonator S23 and a connection point of the series arm resonator S2 and the parallel arm resonator P2. The inductor L is connected in series to the series arm resonator S2. The inductor L may be connected between the series arm resonator S23 and a connection point of the series arm resonator S4 and the parallel arm resonator P3. In the present modification, the reduction of the size of a filter device may be further achieved as in the first preferred embodiment.

It is preferable that the first resonator is a parallel arm resonator and the first inductor is connected in series to the parallel arm resonator. With this, deterioration of the insertion loss of a filter device is less likely to occur.

As illustrated in FIG. 6, in the piezoelectric substrate 2 of the present preferred embodiment, the piezoelectric layer 7 is indirectly provided on the high acoustic velocity support substrate 5 defining and functioning as a high acoustic velocity material layer via the low acoustic velocity film 6. However, the configuration of the piezoelectric substrate 2 is not limited to that described above. Hereinafter, there will be described a third modification and a fourth modification of the first preferred embodiment which are different from the first preferred embodiment only in a configuration of a piezoelectric substrate. In the third modification and the fourth modification, the reduction of the size of a filter device may be further achieved as in the first preferred embodiment. In addition, since the lamination structure including a high acoustic velocity material layer and a piezoelectric layer is provided as in the first preferred embodiment, it is possible to effectively confine the energy of an acoustic wave to a side of the piezoelectric layer.

Figure 11:
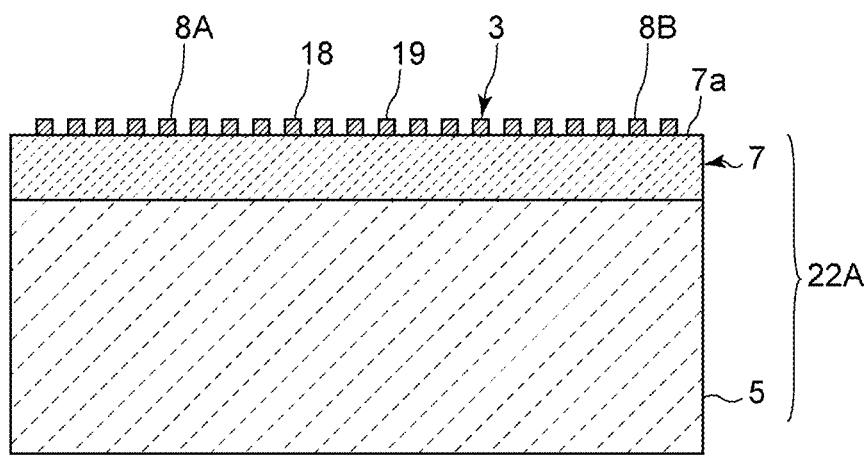
FIG. 11 is a front sectional view of a first resonator according to a third modification of the first preferred embodiment of the present invention.

In the third modification in FIG. 11, a piezoelectric substrate 22A includes the high acoustic velocity support substrate 5 and the piezoelectric layer 7. The piezoelectric layer 7 is directly provided on the high acoustic velocity support substrate 5 defining and functioning as a high acoustic velocity material layer.

Figure 12:
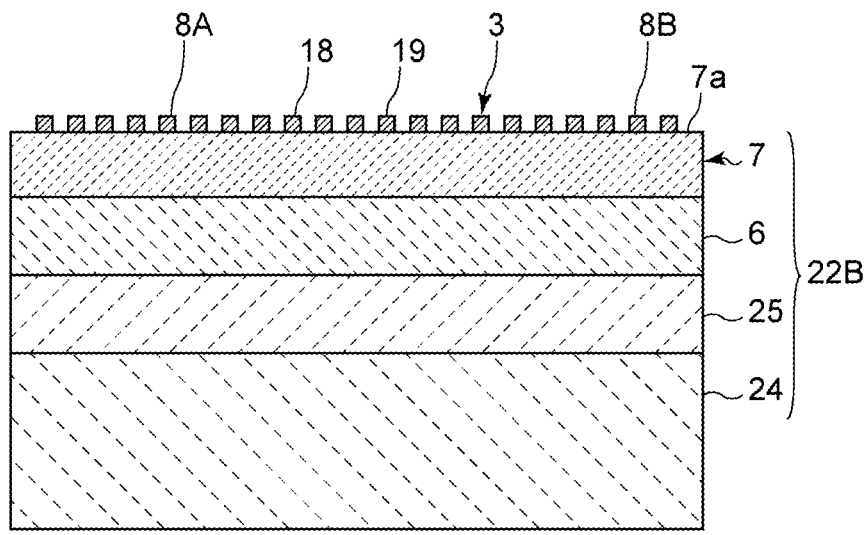
FIG. 12 is a front sectional view of a first resonator according to a fourth modification of the first preferred embodiment of the present invention.

In the fourth modification in FIG. 12, a piezoelectric substrate 22B includes a support substrate 24, a high acoustic velocity film 25 defining and functioning as a high acoustic velocity material layer, the low acoustic velocity film 6, and the piezoelectric layer 7. More specifically, the high acoustic velocity film 25 is provided on the support substrate 24. The low acoustic velocity film 6 is provided on the high acoustic velocity film 25. The piezoelectric layer 7 is provided on the low acoustic velocity film 6.

Examples of the material of the support substrate 24 include piezoelectric materials such as aluminum oxide, lithium tantalate, lithium niobate, and quartz crystal, various ceramics such as alumina, sapphire, magnesia, silicon nitride, aluminum nitride, silicon carbide, zirconia, cordierite, mullite, steatite, and forsterite, dielectrics such as diamond and glass, semiconductors such as silicon and gallium nitride, and resin or the like.

The piezoelectric substrate may be a multilayer body including the support substrate 24, the high acoustic velocity film 25, and the piezoelectric layer 7. Alternatively, the piezoelectric substrate may be a piezoelectric substrate including only a piezoelectric layer.

In the first preferred embodiment and the modifications thereof, the piezoelectric layer 7, including a portion where the IDT electrode 3 is provided, is supported by other layers. The piezoelectric layer 7 is not required to be supported by another layer in a portion overlapping with at least a portion of the IDT electrode 3 in a plan view. More specifically, a hollow portion may be provided in a layer other than the piezoelectric layer 7, in a portion overlapping with at least a portion of the IDT electrode 3 in a plan view. In the case above, it is sufficient that the hollow portion includes an opening on the side of the piezoelectric layer 7. The hollow portion may be provided in only one layer or may be provided across multiple layers. The hollow portion may be a recess or a through-hole, for example. When the hollow portion described above is provided, it is preferable that the resonator use a plate wave.

Here, an IDT electrode of the first resonator is referred to as a first IDT electrode, and an IDT electrode of the second resonator is referred to as a second IDT electrode. Hereinafter, second to fifth preferred embodiments will be described, each of which is different from the first preferred embodiment only in a configuration of the first IDT electrode or the second IDT electrode. In the second to fifth preferred embodiments, the inductor L is connected to the first resonator as in the first preferred embodiment. Therefore, a pass band of a filter device may be widened, and the reduction of the size of a filter device may be further achieved.

Figure 13:
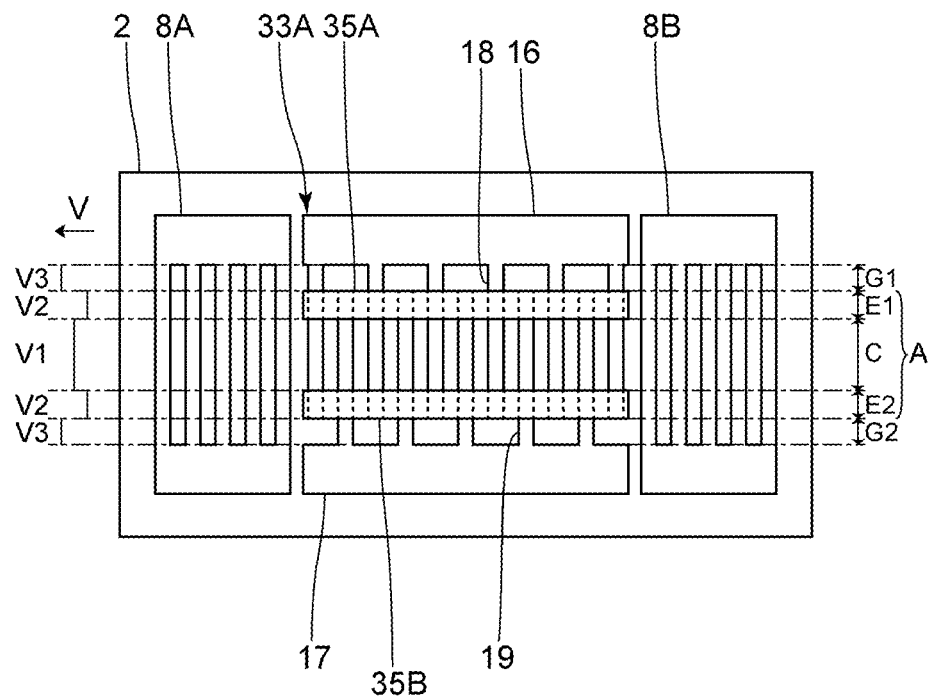
FIG. 13 is a plan view of a first resonator according to a second preferred embodiment of the present invention.
Figure 14:
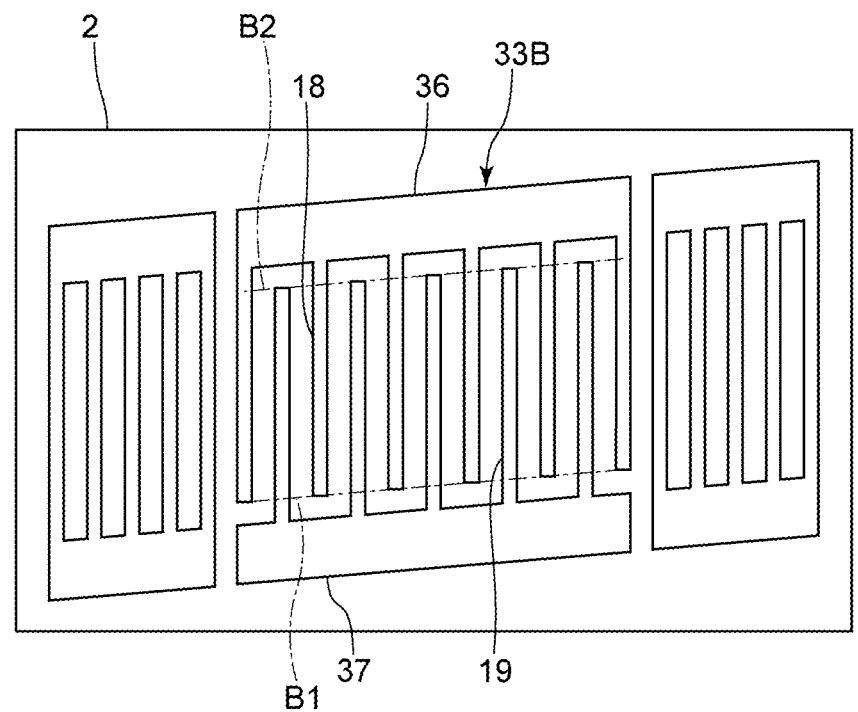
FIG. 14 is a plan view of a second resonator according to the second preferred embodiment of the present invention.

FIG. 13 is a plan view of a first resonator according to a second preferred embodiment of the present invention. FIG. 14 is a plan view of a second resonator according to the second preferred embodiment.

As illustrated in FIG. 13, in the present preferred embodiment, the configuration of a first IDT electrode 33A of the first resonator is different from that of the first preferred embodiment. The first resonator is a surface acoustic wave resonator using a piston mode. As illustrated in FIG. 14, in the present preferred embodiment, the configuration of a second IDT electrode 33B of the second resonator is different from that of the first preferred embodiment. The second IDT electrode 33B is an inclined IDT electrode. Hereinafter, the configuration of each of the first IDT electrode 33A and the second IDT electrode 33B will be described in detail.

As illustrated in FIG. 13, a region in which the first electrode finger 18 and the second electrode finger 19 adjacent to each other overlap in a view from an acoustic wave propagation direction is an overlap region A. The overlap region A includes a center region C, a first edge region E1 and a second edge region E2. Here, a direction in which the multiple first electrode fingers 18 and the multiple second electrode fingers 19 extend is referred to as an electrode finger extending direction. In the present preferred embodiment, the electrode finger extending direction and the acoustic wave propagation direction are orthogonal or substantially orthogonal to each other. The center region C is a region positioned on a center side in the electrode finger extending direction, in the overlap region A. Whereas the first edge region E1 and the second edge region E2 sandwich the center region C in the electrode finger extending direction. The first edge region E1 is positioned on a side of the first busbar 16. The second edge region E2 is positioned on a side of the second busbar 17. Furthermore, the first IDT electrode 33A includes a first gap region G1 and a second gap region G2. The first gap region G1 is positioned between the first edge region E1 and the first busbar 16. The second gap region G2 is positioned between the second edge region E2 and the second busbar 17.

An acoustic velocity in each of the first edge region E1 and the second edge region E2 is lower than an acoustic velocity in the center region C. Whereas, an acoustic velocity in each of the first gap region G1 and the second gap region G2 is higher than the acoustic velocity in the center region C. With this, the piston mode is generated, and a transverse mode is reduced or prevented.

More specifically, in the first IDT electrode 33A of the present preferred embodiment, a mass addition film 35A is provided on the multiple first electrode fingers 18 and the multiple second electrode fingers 19 in the first edge region E1. Similarly, a mass addition film 35B is provided on the multiple first electrode fingers 18 and the multiple second electrode fingers 19 in the second edge region E2. The mass addition film 35A and the mass addition film 35B are made of an appropriate dielectric.

The mass addition film 35A and the mass addition film 35B each have a belt shape. As a result, the mass addition film 35A is provided across portions on the multiple first electrode fingers 18, portions on the multiple second electrode fingers 19, and portions on the piezoelectric substrate 2 positioned between the electrode fingers. The same applies to the mass addition film 35B. With this, the acoustic velocity in each of the first edge region E1 and the second edge region E2 is low.

In the present preferred embodiment, in a portion where the multiple electrode fingers and the mass addition film 35A are laminated, the piezoelectric substrate 2, the multiple electrode fingers, and the mass addition film 35A are laminated in this order. The mass addition film 35A may be provided between the piezoelectric substrate 2 and the multiple first electrode fingers 18, and between the piezoelectric substrate 2 and the multiple second electrode fingers 19. That is, in the portion where the multiple electrode fingers and the mass addition film 35A are laminated, the piezoelectric substrate 2, the mass addition film 35A, and the multiple electrode fingers may be laminated in this order. The same applies to the mass addition film 35B.

The mass addition film 35A and the mass addition film 35B are not required to be provided across the multiple electrode fingers. Each of the multiple mass addition films 35A and each of the multiple mass addition films 35B may be laminated on each of the first electrode fingers 18 and each of the second electrode fingers 19. In the case above, the multiple mass addition films 35A and the multiple mass addition films 35B each may be made of a metal material or dielectric, for example. It is sufficient that the mass addition film 35A or the mass addition film 35B is laminated with at least one of the multiple first electrode fingers 18 and the multiple second electrode fingers 19, in at least one of the first edge region E1 and the second edge region E2. It is preferable that the mass addition film 35A and the mass addition film 35B are laminated with the multiple electrode fingers in both the first edge region E1 and the second edge region E2.

In the first gap region G1, only the multiple first electrode fingers 18 are provided of the multiple first electrode fingers 18 and the multiple second electrode fingers 19. Therefore, the acoustic velocity in the first gap region G1 is high. Similarly, in the second gap region G2, only the multiple second electrode fingers 19 are provided of the multiple first electrode fingers 18 and the multiple second electrode fingers 19. Therefore, the acoustic velocity in the second gap region G2 is high.

When the acoustic velocity in the center region C is denoted as V1, the acoustic velocity in the first edge region E1 and the second edge region E2 is denoted as V2, and the acoustic velocity in the first gap region G1 and the second gap region G2 is denoted as V3, an inequality V2<V1<V3 is satisfied. A relationship between the acoustic velocities described above is illustrated in FIG. 13. In a portion illustrating the relationship between the acoustic velocities in FIG. 13, as indicated by an arrow V, the further a line indicating a height of each acoustic velocity is positioned in a left side, the higher the acoustic velocity is.

In the present preferred embodiment, since the first IDT electrode 33A has the configuration described above, a ratio of a fractional bandwidth to a capacitance may be increased in the first resonator. Thus, a value of a fractional bandwidth may be further increased without increasing the size of the first resonator. Further, it is possible to further decrease the inductance of the first inductor to further increase the value of the fractional bandwidth of the first resonator. Accordingly, a pass band of a filter device may be widened, and the reduction of the size of the filter device may be even further achieved.

Whereas, as illustrated in FIG. 14, the second IDT electrode 33B is an inclined IDT electrode. More specifically, when a virtual line provided by connecting tips of the multiple first electrode fingers 18 is defined as a first envelope B1, the first envelope B1 is inclined against the acoustic wave propagation direction. Similarly, when a virtual line provided by connecting tips of the multiple second electrode fingers 19 is defined as a second envelope B2, the second envelope B2 is inclined against the acoustic wave propagation direction. With this, a spurious mode caused by the transverse mode may be reduced or prevented.

In the second IDT electrode 33B, a first busbar 36 and a second busbar 37 each extend so as to be inclined against the acoustic wave propagation direction. However, the present invention is not limited thereto.

Figure 15:
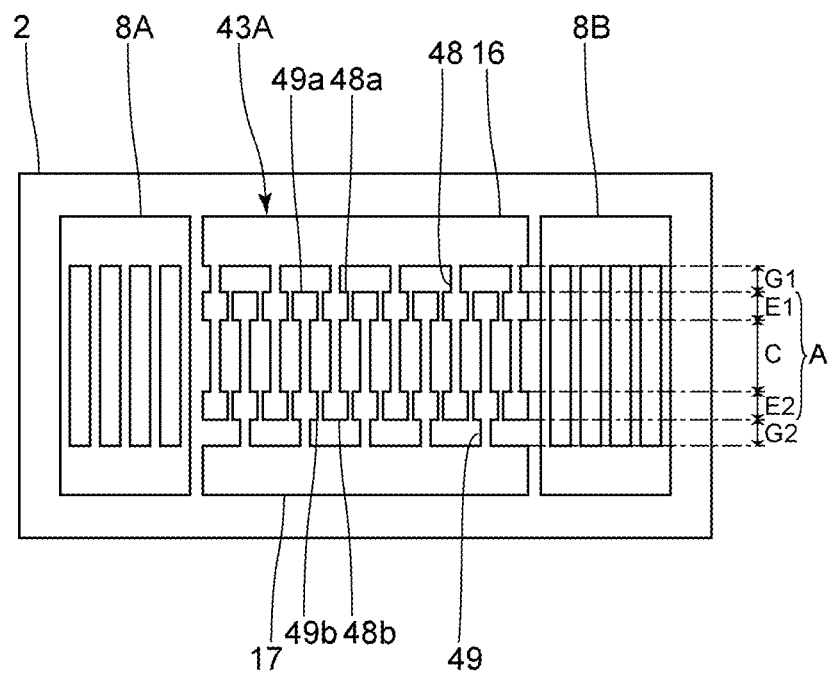
FIG. 15 is a plan view of a first IDT electrode according to a modification of the second preferred embodiment of the present invention.

FIG. 15 is a plan view of a first IDT electrode according to a modification of the second preferred embodiment.

In the present modification, the first resonator uses the piston mode as in the second preferred embodiment. More specifically, each of multiple first electrode fingers 48 of a first IDT electrode 43A includes a wide portion 48a positioned in the first edge region E1. Furthermore, each of the multiple first electrode fingers 48 includes a wide portion 48b positioned in the second edge region E2. A width of the first electrode finger 48 in each of the wide portion 48a and the wide portion 48b is wider than a width of the first electrode finger 48 in the center region C. A width of an electrode finger is a size of an electrode finger along the acoustic wave propagation direction. Similarly, each of multiple second electrode fingers 49 includes a wide portion 49a in the first edge region E1. Each of the multiple second electrode fingers 49 includes a wide portion 49b in the second edge region E2. With these, the acoustic velocity in the first edge region E1 and the second edge region E2 may be lowered. It is sufficient that at least one of the multiple first electrode fingers 48 and the multiple second electrode fingers 49 includes a wide portion in at least one region of the first edge region E1 and the second edge region E2.

In the case above, a ratio of a fractional bandwidth to a capacitance may be increased in the first resonator using the first IDT electrode 43A. The ratio in the resonator using the first IDT electrode 33A illustrated in FIG. 13 is larger than the ratio in the resonator using the first IDT electrode 43A of the present modification. Therefore, the first IDT electrode 33A is preferably used in the first resonator.

Figure 16:
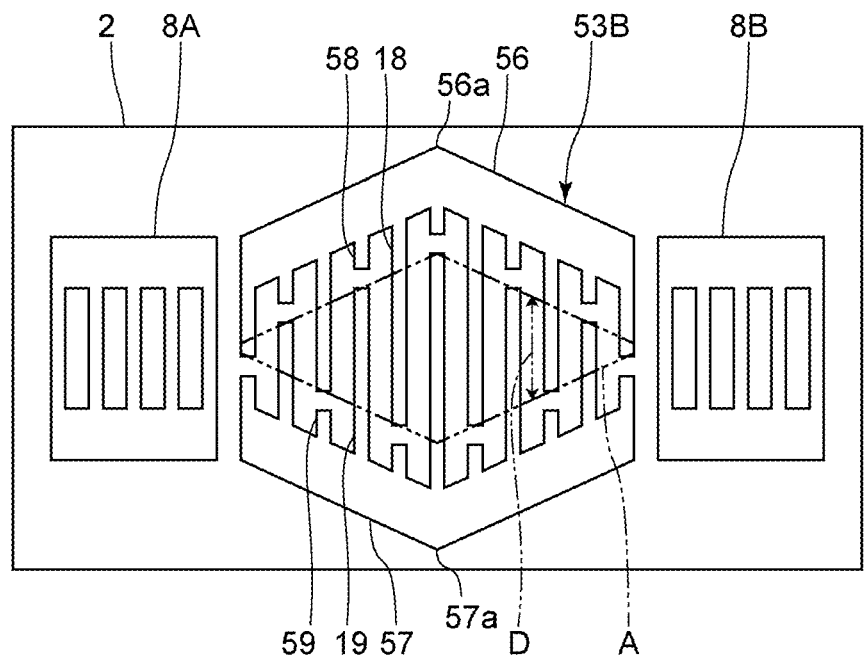
FIG. 16 is a plan view of a second IDT electrode according to a third preferred embodiment of the present invention.

FIG. 16 is a plan view of a second IDT electrode according to a third preferred embodiment of the present invention.

The present preferred embodiment is different from the second preferred embodiment in that the overlap region A of a second IDT electrode 53B includes weighting. Except for the point above, the filter device of the present preferred embodiment has the same or substantially the same configuration as that of the filter device of the second preferred embodiment. The first resonator of the present preferred embodiment includes the first IDT electrode 33A illustrated in FIG. 13.

The second IDT electrode 53B includes multiple first dummy electrode fingers 58 and multiple second dummy electrode fingers 59. One end of each of the multiple first dummy electrode fingers 58 is connected to a first busbar 56, respectively. The other end of each of the multiple first dummy electrode fingers 58 faces each of the multiple second electrode fingers 19, respectively. One end of each of the multiple second dummy electrode fingers 59 is connected to a second busbar 57, respectively. The other end of each of the multiple second dummy electrode fingers 59 faces each of the multiple first electrode fingers 18, respectively.

Here, a size of the overlap region A along the electrode finger extending direction is referred to as an overlap width D. In the second IDT electrode 53B, the overlap width D varies in the acoustic wave propagation direction. More specifically, the overlap width D decreases from a center of the second IDT electrode 53B toward an outer side portion in the acoustic wave propagation direction. In the present preferred embodiment, the overlap region A has, for example, a rhombic or substantially rhombic shape in a plan view.

However, the shape of the overlap region A in a plan view is not limited to the above. For example, the edge portion of the overlap region A in the electrode finger extending direction may have a curved shape. Alternatively, for example, the overlap width D may periodically vary in the acoustic wave propagation direction. More specifically, there may be multiple portions in which the overlap width D increases and multiple portions in which the overlap width D decreases, from one side to the other side in the acoustic wave propagation direction.

It is sufficient that the overlap region A of the second IDT electrode 53B includes a portion in which the overlap width D varies in the acoustic wave propagation direction. For example, the second IDT electrode 53B may include a portion with a constant overlap width in the acoustic wave propagation direction.

In the present preferred embodiment, each of the first busbar 56 and the second busbar 57 includes a portion that extends so as to be inclined against the acoustic wave propagation direction. The first busbar 56 includes a bent portion 56a. The second busbar 57 includes a bent portion 57a. However, the shapes of the first busbar 56 and the second busbar 57 are not limited to those described above. For example, the first busbar 56 and the second busbar 57 may have a linear shape extending in parallel or substantially in parallel with the acoustic wave propagation direction. In the case above, it is sufficient that the overlap width D varies in the acoustic wave propagation direction because of a variation of a length of each of the multiple first electrode fingers 18, the multiple second electrode fingers 19, the multiple first dummy electrode fingers 58, and the multiple second dummy electrode fingers 59 in the acoustic wave propagation direction. A length of an electrode finger is a size of an electrode finger along the electrode finger extending direction.

As described above, in the third preferred embodiment, the first resonator preferably includes the same first IDT electrode 33A as the second preferred embodiment. A ratio of a fractional bandwidth to a capacitance in the resonator using the first IDT electrode 33A is greater than a ratio of a fractional bandwidth to a capacitance in the resonator using the second IDT electrode 53B. Therefore, the first inductor to widen a pass band of a filter device may be reduced in size, and the reduction of the size of a filter device may be further achieved as in the second preferred embodiment.

The fourth preferred embodiment is different from the second preferred embodiment in that the second IDT electrode has the same or substantially the same configuration as the first IDT electrode 43A illustrated in FIG. 15. Except for the point above, the filter device of the present preferred embodiment has the same or substantially the same configuration as that of the filter device of the second preferred embodiment. The first resonator of the present preferred embodiment includes the first IDT electrode 33A illustrated in FIG. 13. In the present preferred embodiment, both of the first resonator and the second resonator use the piston mode.

As described above, the ratio of the fractional bandwidth to the capacitance in the resonator including the first IDT electrode 33A is greater than a ratio of a fractional bandwidth to capacitance in the resonator using the first IDT electrode 43A. Therefore, the first inductor to widen a pass band of a filter device may be reduced in size, and the reduction of the size of a filter device may be further achieved as in the second preferred embodiment.

Figure 17:
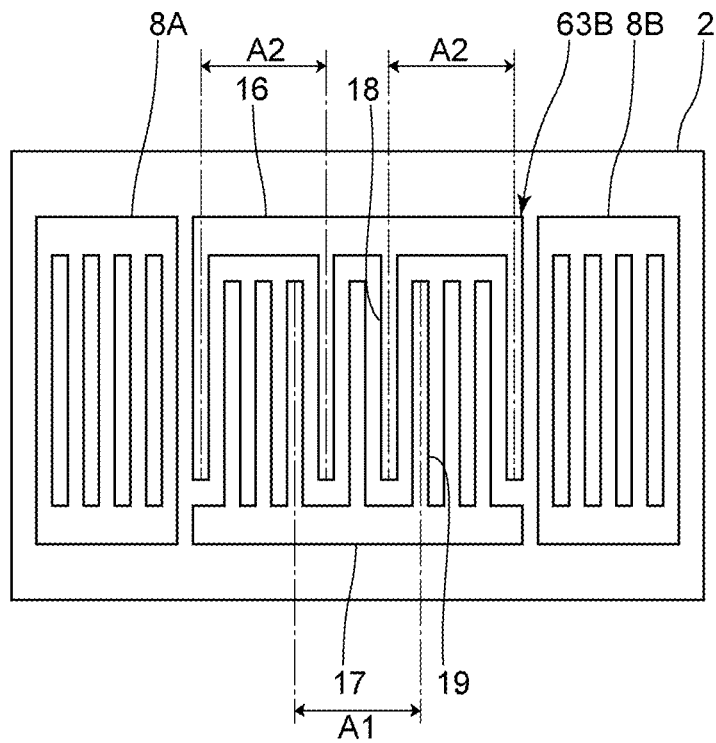
FIG. 17 is a plan view of a second IDT electrode according to a fifth preferred embodiment of the present invention.

FIG. 17 is a plan view of a second IDT electrode according to the fifth preferred embodiment.

The present preferred embodiment is different from the first preferred embodiment in the configuration of a second IDT electrode 63B. Except for the point above, the filter device of the present preferred embodiment has the same or substantially the same configuration as that of the filter device 1 of the first preferred embodiment.

In the present preferred embodiment, an overlap region includes a first portion A1 and a second portion A2. In the first portion A1, the first electrode finger 18 and the second electrode finger 19 are alternately arranged. That is, in the first portion A1, one end of each of the electrode fingers adjacent to each other are connected to busbars different from each other, respectively. In the present preferred embodiment, an electrode finger pitch is constant or substantially constant in the first portion A1. The electrode finger pitch is a center to center distance of electrode fingers adjacent to each other. The first and second IDT electrodes in each of the preferred embodiments described above include only the first portion A1.

Here, in the first portion A1, in three consecutive electrode fingers, the center to center distance of electrode fingers at both ends is defined as about 1λ. For example, in a portion in which the first electrode finger 18, the second electrode finger 19, and the first electrode finger 18 are arranged in this order, the center to center distance between the first electrode fingers 18 is about 1λ. Whereas, in the second portion A2, three consecutive fingers are arranged in the order of the first electrode finger 18, the second electrode finger 19, and the second electrode finger 19. Alternatively, in the second portion A2, all of the three consecutive fingers are the second electrode finger 19. As described above, in the second portion A2, the first electrode finger 18 and the second electrode finger 19 are not alternately disposed in the number of three or more, in a range of a distance of about 1λ along the acoustic wave propagation direction. That is, in the range described above, the number of adjacent electrode fingers consecutively disposed, including each end connected to each of busbars different from each other, respectively, is two or less.

In the present preferred embodiment, three second electrode fingers 19 are consecutively arranged in the acoustic wave propagation direction in the second portion A2. In the second portion A2, it is sufficient that each end of two or more electrode fingers, consecutively arranged in the acoustic wave propagation direction, is connected to the same busbars, respectively. The second portions A2 may be arranged periodically.

Whereas, the first resonator includes an IDT electrode 3 defining and functioning as the first IDT electrode illustrated in FIG. 5. In the overlap region A of the IDT electrode 3, each end of electrode fingers adjacent to each other is connected to each of busbars different from each other.

A ratio of a fractional bandwidth to a capacitance in the resonator including a first IDT electrode 3A is greater than a ratio of a fractional bandwidth to a capacitance in the resonator using the second IDT electrode 63B. Therefore, the first inductor to widen a pass band of a filter device may be reduced in size, and the reduction of the size of a filter device may be further achieved as in the first preferred embodiment. As described above, when both of the IDT electrode having the configuration in FIG. 5 and the IDT electrode having the configuration in FIG. 17 are provided, it is preferable that the first IDT electrode have the configuration in FIG. 5.

Figure 18:
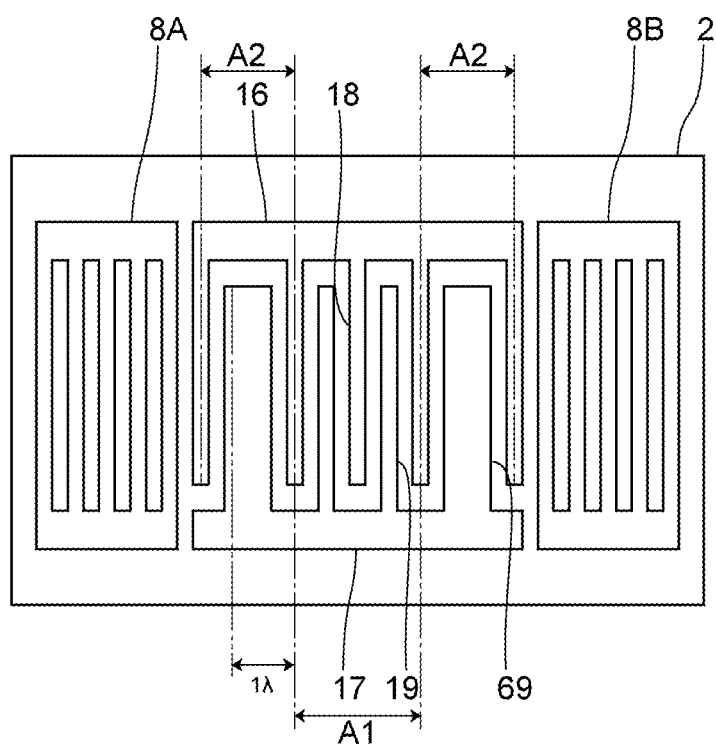
FIG. 18 is a plan view of a second IDT electrode according to a modification of the fifth preferred embodiment of the present invention.

In the second portion A2 of the second IDT electrode 63B, the electrode fingers connected to the same busbar are not required to be consecutively disposed. In a modification of the fifth preferred embodiment in FIG. 18, a width of a second electrode finger 69 in the second portion A2 is wider than a width of the second electrode finger 19 in the first portion A1. More specifically, when two second electrode fingers 19 are consecutively disposed in the fifth preferred embodiment, the second electrode finger 69 corresponds to an electrode finger in which the two second electrode fingers 19 are integrated. A portion where one second electrode finger 69 and one first electrode finger 18 are arranged side by side corresponds to a portion where three electrode fingers are arranged side by side in the first portion A1. Thus, in the second portion A2, only one first electrode finger 18 and one second electrode finger 69 are disposed within the range of the distance of 1λ along the acoustic wave propagation direction. Therefore, within the range described above, the number of electrode fingers adjacent to each other consecutively disposed, including each end connected to each of busbars different from each other, respectively, is two or less.

As described above, in the present modification, the second electrode finger 69 corresponds to an electrode finger in which two second electrode fingers 19 are integrated. Thus, a width of the second electrode finger 69 in the second portion A2 corresponds to twice the width of the second electrode finger 19 in the first portion A1 plus a width of a portion between the electrode fingers. Therefore, the width of the second electrode finger 69 in the second portion A2 is wider than twice the width of the second electrode finger 19 in the first portion A1. The second electrode finger 69 may correspond to an electrode finger in which three or more consecutive second electrode fingers 19 are integrated. In the present modification, the reduction of the size of a filter device may be further achieved as in the fifth preferred embodiment.

Figure 19:
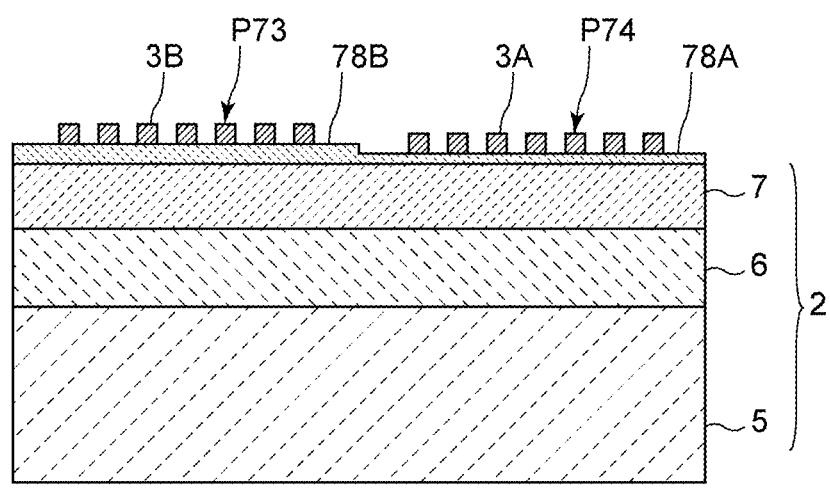
FIG. 19 is a front sectional view of a first resonator and a second resonator according to a sixth preferred embodiment of the present invention.

FIG. 19 is a front sectional view of a first resonator and a second resonator in a sixth preferred embodiment of the present invention.

The present preferred embodiment is different from the first preferred embodiment in that the first resonator includes a dielectric film 78A and the second resonator includes a dielectric film 78B. A parallel arm resonator P74 defining and functioning as the first resonator and a parallel arm resonator P73 defining and functioning as the second resonator are illustrated in FIG. 19. Except for the point above, the filter device of the present preferred embodiment has the same or substantially the same configuration as that of the filter device 1 of the first preferred embodiment. The IDT electrode of the first resonator is the first IDT electrode 3A, and the IDT electrode of the second resonator is a second IDT electrode 3B.

The dielectric film 78A is provided between the piezoelectric substrate 2 and the first IDT electrode 3A. The dielectric film 78B is provided between the piezoelectric substrate 2 and the second IDT electrode 3B. In the present preferred embodiment, the dielectric film 78A is thinner than the dielectric film 78B. In the case above, the value of the fractional bandwidth of the first resonator may be increased. Therefore, as in each preferred embodiment described above, a pass band of a filter device may be more surely widened, and the reduction of the size of a filter device may be achieved more surely.

In the present preferred embodiment, the dielectric film 78A and the dielectric film 78B are integrally provided and have thicknesses different from each other. The dielectric film 78A and the dielectric film 78B may be provided as separate structures.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A filter device, comprising:
a plurality of resonators including at least one series arm resonator and at least one parallel arm resonator; wherein
the plurality of resonators include a first resonator and at least one second resonator, the first resonator having a largest value of a fractional bandwidth among the plurality of resonators; and
an inductor is connected in series to the first resonator.

2. The filter device according to claim 1, wherein the first resonator is one of the at least one parallel arm resonator.

3. The filter device according to claim 1, wherein
the inductor is a first inductor;
at least one second inductor is connected to the at least one second resonator; and
an inductance of the at least one second inductor is smaller than an inductance of the first inductor.

4. The filter device according to claim 1, wherein
the first resonator includes a first IDT electrode, the at least one second resonator includes a second IDT electrode, each of the first IDT electrode and the second IDT electrode includes a pair of busbars and a plurality of electrode fingers;
in the first IDT electrode, a region in which electrode fingers of the plurality of electrode fingers adjacent to each other overlap in a view from an acoustic wave propagation direction is an overlap region;

the overlap region includes a center region at a center in a direction in which the plurality of electrode fingers extend, a pair of edge regions sandwiching the center region in the direction in which the plurality of electrode fingers extend, and a pair of gap regions between the pair of busbars and the pair of edge regions;

an acoustic velocity in the pair of edge regions is lower than an acoustic velocity in the center region;

an acoustic velocity in the pair of gap regions is higher than the acoustic velocity in the center region; and in the second IDT electrode, when a virtual line connecting second ends of the plurality of electrode fingers whose first ends are connected to one of the pair of busbars, and a virtual line connecting second ends of the plurality of electrode fingers whose first ends are connected to another of the pair of busbar are defined as a pair of envelopes, the pair of envelopes are inclined with respect to the acoustic wave propagation direction.

5. The filter device according to claim 1, wherein the first resonator includes a first IDT electrode;

the at least one second resonator includes a second IDT electrode;

each of the first IDT electrode and the second IDT electrode includes a pair of busbars and a plurality of electrode fingers;

in each of the first IDT electrode and the second IDT electrode, a region in which electrode fingers of the plurality of electrode fingers adjacent to each other overlap in a view from an acoustic wave propagation direction is an overlap region;

in the first IDT electrode, the overlap region includes a center region at a center in a direction in which the plurality of electrode fingers extend, a pair of edge regions sandwiching the center region in the direction in which the plurality of electrode fingers extend, and a pair of gap regions between the pair of busbars and the pair of edge regions;

an acoustic velocity in the pair of edge regions is lower than an acoustic velocity in the center region;

an acoustic velocity in the pair of gap regions is higher than the acoustic velocity in the center region; and in the second IDT electrode, when a size of the overlap region along the direction in which the plurality of electrode fingers extend is defined as an overlap width, the overlap region includes a portion in which the overlap width varies in the acoustic wave propagation direction.

6. The filter device according to claim 1, wherein the first resonator includes a first IDT electrode;

the at least one second resonator includes a second IDT electrode;

each of the first IDT electrode and the second IDT electrode includes a pair of busbars and a plurality of electrode fingers;

in each of the first IDT electrode and the second IDT electrode, a region in which electrode fingers of the plurality of electrode fingers adjacent to each other overlap in a view from an acoustic wave propagation direction is an overlap region;

the overlap region includes a center region at a center in a direction in which the plurality of electrode fingers extend, and a pair of edge regions sandwiching the center region in the direction in which the plurality of electrode fingers extend;

in each of the pair of edge regions of the first IDT electrode, a mass addition film is provided to overlap with at least one of the plurality of electrode fingers in a plan view; and in at least one of the plurality of electrode fingers of the second IDT electrode, a width in one of the pair of edge regions is larger than a width in the center region, and in at least one of the plurality of electrode fingers, a width in another of the pair of edge regions is larger than a width in the center region.

7. The filter device according to claim 1, wherein the first resonator includes a first IDT electrode;

the at least one second resonator includes a second IDT electrode;

each of the first IDT electrode and the second IDT electrode includes a pair of busbars and a plurality of electrode fingers;

in each of the first IDT electrode and the second IDT electrode, a region in which electrode fingers of the plurality of electrode fingers adjacent to each other overlap in a view from an acoustic wave propagation direction is an overlap region;

in the overlap region of the first IDT electrode, first ends of the electrode fingers adjacent to each other are connected to the busbars different from each other;

the overlap region of the second IDT electrode includes a first portion in which first ends of the electrode fingers adjacent to each other are connected to the busbars different from each other;

in the first portion, when a center to center distance between electrode fingers of both ends of three consecutive electrode fingers is about $1\lambda$, the overlap region of the second IDT electrode further includes a second portion in which a number of the electrode fingers adjacent to each other, whose first ends are connected to busbars different from each other, consecutively disposed in a range of a distance of about $1\lambda$ along the acoustic wave propagation direction, is two or less.

8. The filter device according to claim 1, wherein each of the first resonator and the at least one second resonator includes a piezoelectric layer, an IDT electrode on the piezoelectric layer, and a dielectric film between the piezoelectric layer and the IDT electrode; and a thickness of the dielectric film of the first resonator is smaller than a thickness of the dielectric film of the at least one second resonator.

9. The filter device according to claim 1, wherein the plurality of resonators include a high acoustic velocity material layer, a piezoelectric layer on the high acoustic velocity material layer, and an IDT electrode on the piezoelectric layer; and an acoustic velocity of a bulk wave propagating through the high acoustic velocity material layer is higher than an acoustic velocity of an acoustic wave propagating through the piezoelectric layer.

10. The filter device according to claim 9, wherein the high acoustic velocity material layer is a high acoustic velocity support substrate.

11. The filter device according to claim 9, further comprising:

a support substrate; wherein the high acoustic velocity material layer is a high acoustic velocity film provided on the support substrate.

12. The filter device according to claim 9, further comprising:

a low acoustic velocity film between the high acoustic velocity material layer and the piezoelectric layer; wherein an acoustic velocity of a bulk wave propagating through the low acoustic velocity film is lower than an acoustic velocity of a bulk wave propagating through the piezoelectric layer.

13. The filter device according to claim 1, wherein the inductor is defined by a wiring line and includes at least one wiring electrode.

14. The filter device according to claim 13, wherein the inductor includes a plurality of the wiring electrodes and a via electrode connecting the wiring electrodes to each other.

15. The filter device according to claim 13, wherein the plurality of resonators each include a piezoelectric layer, an IDT electrode on the piezoelectric layer, a support on the piezoelectric layer and including a cavity surrounding each of the IDT electrodes, and a cover on the support to cover the cavity; and the inductor is provided in the cover.

16. The filter device according to claim 13, further comprising:

a mounting substrate on which the plurality of resonators are provided; wherein the inductor is provided on the mounting substrate.

* * * * *